(12) United States Patent
Deboy (10) Patent No.: US 7,091,557 B2
(45) Date of Patent: Aug. 15, 2006

(54) SEMICONDUCTOR COMPONENT WITH INCREASED DIELECTRIC STRENGTH AND/OR REDUCED ON RESISTANCE

(75) Inventor: Gerald Deboy, München (DE)

(73) Assignee: Infineon Technologies AG, Munich (DE)

( * ) Notice: Subject to any disclaimer, the term of this patent is extended or adjusted under 35 U.S.C. 154(b) by 53 days.

(21) Appl. No.: 10/790,979

(22) Filed: Mar. 2, 2004

(65) Prior Publication Data

US 2004/0217377 A1 Nov. 4, 2004

(30) Foreign Application Priority Data

Mar. 4, 2003 (DE) ................................ 103 09 400

(51) Int. Cl.
*H01L 29/93* (2006.01)

(52) U.S. Cl. .................... 257/339; 257/139; 257/141; 257/341; 257/342; 257/343; 257/347; 257/401

(58) Field of Classification Search ................ 257/339, 257/139, 141, 341, 342, 343, 347, 401

See application file for complete search history.

(56) References Cited

U.S. PATENT DOCUMENTS

| 4,754,310 | A | 6/1988 | Coe |
| 6,097,063 | A | 8/2000 | Fujihira |
| 2003/0207536 | A1* | 11/2003 | Miyasaka et al. ........... 438/268 |

FOREIGN PATENT DOCUMENTS

| DE | 198 40 032 | 11/1999 |
| DE | 102 55 830 | 6/2004 |

* cited by examiner

*Primary Examiner*—Long Pham
(74) *Attorney, Agent, or Firm*—Dicke, Billig & Czaja, PLLC (57) ABSTRACT

The invention relates to a semiconductor component having a first semiconductor zone of a first conduction type, a second semiconductor zone of a second conduction type and a drift zone arranged between the first and second semiconductor zones, which drift zone has at least two semiconductor zones doped complementarily to one another, the degree of compensation varying at least in a section of the drift zone in a direction perpendicular to a current flow direction running between the first and second semiconductor zones.

24 Claims, 10 Drawing Sheets

SEMICONDUCTOR COMPONENT WITH INCREASED DIELECTRIC STRENGTH AND/OR REDUCED ON RESISTANCE

CROSS-REFERENCE TO RELATED APPLICATIONS

This Utility Patent Application claims priority to German Patent Application No. DE 103 09 400.8, filed on Mar. 4, 2003, which is incorporated herein by reference.

BACKGROUND

The present invention relates to semiconductor components. More specifically, the semiconductor components relate to so-called compensation components having a drift zone which, adjacent to one another, have in each case complementarily doped semiconductor zones that mutually deplete one another in the off-state case, and to semiconductor components having a drift zone of only one conduction type.

Semiconductor components having a drift zone which have a compensation structure are sufficiently known and described for example in U.S. Pat. No. 4,754,310 or U.S. Pat. No. 6,097,063.

What is critical for the properties of the drift zone in the off-state case of the component is, in particular, the degree of compensation, as is explained thoroughly in DE 198 40 032 C1. The degree of compensation K is defined for n-conducting components as $$K=(N_n-N_p)/N_n \quad (1)$$

and is defined for p-conducting components as $$K=(N_p-N_n)/N_p, \quad (2)$$

where $N_n$ specifies the number of n-type dopant atoms and $N_p$ specifies the number of p-type dopant atoms in a volume region considered.

When considered over the entire volume, the degree of compensation is preferably zero. The number of p-type dopant atoms corresponds to the number of p-type dopant atom, so that, in the off-state case, each free n-type charge carrier finds a free p-type charge carrier, which mutually compensate for one another, as a result of which free charge carriers are no longer present in the drift zone at maximum reverse voltage.

The above-mentioned DE 198 40 032 C1 proposes varying the degree of compensation along a current flow direction in the drift zone in order to achieve a high breakdown strength and a high current-carrying capacity before or at breakdown. In this case, the doping is effected in such a way that p-type charge carriers predominate in a first region of the drift zone, which first region adjoins a pn junction between a p-doped semiconductor zone and n-doped regions of the drift zone, as a result of which the degree of compensation is negative there, while in a region near to a second semiconductor zone, n-type charge carriers predominate in the drift zone. In a third region of the drift zone between the first and second semiconductor zones, the degree of compensation is preferably zero, that is to say the complementarily doped semiconductor zones which are in each case arranged adjacent there completely compensate for one another in the off-state case.

SUMMARY

One embodiment of the present invention provides a semiconductor component, in particular a compensation semiconductor component, with an increased dielectric strength and/or a reduced on resistance.

The compensation semiconductor component according to one embodiment of the invention comprises a first semiconductor zone of a first conduction type, a second semiconductor zone of a second conduction type and a drift zone arranged between the first semiconductor zone and the second semiconductor zone. The drift zone has at least one third semiconductor zone of the second conduction type extending between the first semiconductor zone and the second semiconductor zone and at least one fourth semiconductor zone of the first conduction type adjoining the third semiconductor zone. The third zone enables a current flow between the first semiconductor zone and the second semiconductor zone in a current flow direction. The charge carriers of the third and fourth zones at least partially compensate for one another in accordance with the compensation principle in the event of a reverse-biased junction between the first semiconductor zone and the third semiconductor zone.

The semiconductor component according to one embodiment of the invention may be formed as a diode, MOS transistor, thyristor or IGBT.

In the case of a diode, the first semiconductor zone is p-doped, for example, and forms the anode zone of the diode, and the second semiconductor zone is n-doped and forms the cathode zone of the diode. In the likewise n-doped third semiconductor zone, in the event of a forward-biased pn junction between the first and third semiconductor zones, in the case of a diode, an electron current flows from the cathode to the anode and also, in the opposite direction, a hole current flows from the anode to the cathode. In this connection, "current flow direction" hereinafter denotes either the flow direction of the electron current or of the hole current. The application of a voltage at which the semiconductor junction between the body zone and the third semiconductor zone is reverse-biased leads to the formation of a space charge zone, on account of which the at least one third and the at least one fourth semiconductor zone at least partially deplete one another.

In the case of a MOS transistor, the first semiconductor zone forms the body zone of said transistor and is likewise p-doped in the case of an n-conducting transistor, while the second semiconductor zone forms the drain zone of said transistor and is n-doped in the case of an n-conducting transistor. In the first semiconductor zone forming the body zone, in the case of a MOS transistor, in a known manner, a fifth semiconductor zone doped complementarily to said first semiconductor zone is formed, and forms the source zone of the transistor. Furthermore, a control electrode is present, which is formed in a manner insulated from the body zone, the source zone and the drift zone and is arranged in such a way that, upon application of a suitable drive potential, a conductive channel forms in the body zone between the source zone and the drift zone. In the event of a driven control electrode and voltage present between the first and second semiconductor zones, in the case of an n-conducting MOS transistor, an electron current flows between the first and second semiconductor zones in the third semiconductor zone, the direction of said current depending on the polarity of said voltage. In the event of a control electrode not being driven, if no conductive channel is formed in the body zone, the application of a voltage at which the semiconductor junction between the body zone and the third semiconductor zone is reverse-biased leads to the formation of a space charge zone, on account of which the at least one third and the at least one fourth semiconductor zone at least partially deplete one another. This effect is the same in diodes and MOS transistors despite their different behavior in the on state.

Furthermore the semiconductor component according to the present invention provides for the degree of compensation to vary at least in a section of the drift zone in a direction perpendicular to the current flow direction. This makes use of the insight that in the case of lateral components in which the drift zone ends at a surface of a semiconductor body in which the component is integrated, the dielectric strength of the component is significantly limited by the lower dielectric strength at the surface. This lower dielectric strength results from field spikes at the surface on account of surface influences such as, for example, jumps in the thickness of an insulation layer, for example at the locations at which the thin insulation layer of the control electrode merges with a thicker covering insulation layer. In the case of a component according to one embodiment of the invention, the degree of compensation varies in such a way that it is not equal to zero in the region of the surface, in particular is negative, and rises vertically with respect to the current flow direction. A degree of compensation of at least approximately zero is achieved in an inner region of the drift zone. Owing to the degree of compensation not equal to zero in the edge region, the electric field strengths decrease in the edge region or surface region in the off-state case, while maximum electric field strengths arise in the fully compensated inner region. The reduction of the field strengths in the edge region leads overall to an increase in the dielectric strength of the component. If the entire drift zone is considered, then the quantity of dopant atoms of the first conduction type corresponds to the quantity of dopant atoms of the second conduction type, as a result of which the free p-type and n-type charge carriers in the drift zone mutually completely deplete one another in the event of a maximum reverse voltage.

It should be pointed out that it is always necessary to consider sections of the drift zone which in each case comprise at least one third semiconductor zone and an adjacent fourth semiconductor zone, in order to determine the respective value of the degree of compensation.

The invention is not restricted to horizontal components, and may also be applied to vertical components.

The drift zone with the third and fourth complementarily doped semiconductor zones may be constructed in a wide variety of ways.

One embodiment provides for the drift zone to have a plurality of third and fourth semiconductor zones which are in each case arranged alternately and in each case extend in layer-like fashion in the current flow direction.

A further embodiment provides for the drift zone to have a third semiconductor zone, in which a multiplicity of fourth semiconductor zones formed in pillar-type fashion and in each case arranged at a distance from one another are present, the longitudinal direction of which runs perpendicular to the current flow direction.

In a further embodiment, the drift zone comprises a plurality of semiconductor layers arranged one above the other, third and fourth semiconductor zones, which extend in elongated fashion in the current flow direction, being arranged alternately next to one another in each semiconductor layer. In this case, the third semiconductor zones of the individual layers are arranged one above the other and the fourth semiconductor zones of the individual layers are arranged one above the other.

In order to vary the degree of compensation perpendicular to the current flow direction, it is possible for the third semiconductor zone(s) to be doped identically in each case and for the doping of the fourth semiconductor zones to vary in a direction perpendicular to the current flow direction. In the case of a lateral semiconductor component, in which the drift zone adjoins a surface of the semiconductor body parallel to the current flow direction, the degree of compensation is preferably negative in the region of this surface (a p-type net doping is thus present) and rises with increasing distance from the surface in the direction perpendicular to the current flow direction. This can be achieved, in the case of a respectively identical doping of the third semiconductor zones, by virtue of the doping of the fourth semiconductor zones decreasing with increasing distance from the surface. In this case, this variation of the doping may be effected step by step in that, in the case of a plurality of fourth semiconductor zones arranged one above the other parallel to the current flow direction, said semiconductor zones are inherently in each case doped homogeneously, but their doping decreases from layer to layer in the direction perpendicular to the current flow direction.

Correspondingly, in order to vary the degree of compensation, it is possible for the fourth semiconductor zones to be doped identically in each case and for the doping of the third semiconductor zone(s) to be varied perpendicular to the current flow direction, in which case, in the case of the abovementioned lateral component with a rising degree of compensation proceeding from the surface, the doping of the third semiconductor zone(s) increases proceeding from the surface. This variation of the doping may in this case be effected step by step in that, in the case of a plurality of third semiconductor zones arranged one above the other parallel to the current flow direction, said semiconductor zones are inherently in each case doped homogeneously, but their doping increases from layer to layer in the direction perpendicular to the current flow direction. This step-by-step doping may also be achieved by constructing a third semiconductor layer in layer-by-layer fashion and doping the individual layers differently.

In order to vary the degree of compensation, it is also possible to vary both the doping of the third semiconductor zones and the doping of the fourth semiconductor zones perpendicular to the current flow direction.

One embodiment of the invention furthermore provides for varying the degree of compensation in the drift zone also in the current flow direction, in order thereby to achieve a high current-carrying capacity before or at breakdown.

This may be achieved by virtue of the fact that the doping of the third and/or fourth semiconductor zones is also varied along the current flow direction.

In the case of the embodiment explained, in which the drift zone has a plurality of semiconductor layers each having a plurality of third and fourth semiconductor zones arranged alternately adjacent, it is possible to achieve a variation of the degree of compensation in the current flow direction by virtue of the fact that the third semiconductor zones and the fourth semiconductor zones run approximately in wedge-shaped fashion in plan view in the current flow direction, the fourth semiconductor zones tapering proceeding from the first semiconductor zone in the direction of the second semiconductor zone, while the third semiconductor zones widen correspondingly. By virtue of this geometry of the third and fourth semiconductor zones, it is possible to set a net doping of the first conduction type in the drift zone at least in a section adjoining the first semiconductor zone, which section runs perpendicular to the current flow direction, and it is possible to set a net doping of the second conduction type in the drift zone at least in a section adjoining the second semiconductor zone, which section runs perpendicular to the current flow direction.

The further semiconductor component according to the invention comprises a first semiconductor zone of a first conduction type, a second semiconductor zone of a second conduction type, a drift zone of the second conduction type arranged between the first semiconductor zone and the second semiconductor zone, which drift zone enables the current flow from the first semiconductor zone to the second semiconductor zone in a current flow direction. In order to reduce a current density in an edge region running parallel to the current flow direction and in order to distribute the current flow more uniformly over the available volume of the drift zone, it is provided in this case that, at least in a section of the drift zone, the doping concentration of dopant atoms of the second conduction type varies in a direction perpendicular to the current flow direction and increases proceeding from said edge region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 illustrates a further exemplary embodiment of a semiconductor component according to the invention, formed as a MOS transistor, in side view in cross section (FIG. 5A) and an exemplary profile of the degree of compensation perpendicular to the current flow direction (FIG. 5B).

In the figures, unless specified otherwise, identical reference symbols designate identical parts with the same meaning.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the present invention is explained in more detail below with reference to an n-conducting diode and with reference to n-conducting MOS transistors. Semiconductor zones of the first conduction type are p-doped semiconductor zones and semiconductor zones of the second conduction type are n-doped semiconductor zones, which in the case of the diode, form the anode zone and cathode zone thereof and, in the case of the MOS transistor, form the body zone and drain zone thereof. The invention, however, is not restricted to n-conducting components, but rather can also be applied to p-conducting components. Furthermore, the statements made below correspondingly applying to such p-conducting components if the n-doped zones in the explanations below are replaced by p-doped zones and the p-doped zones below are replaced by n-doped zones. Furthermore, the invention is not limited to diodes and MOS transistors, but can be applied to arbitrary further semiconductor components, for example IGBTs or thyristors, which have a pn junction biased in the on state or in the off state, depending on an applied voltage, and a drift zone adjoining the pn junction.

Figure 1:
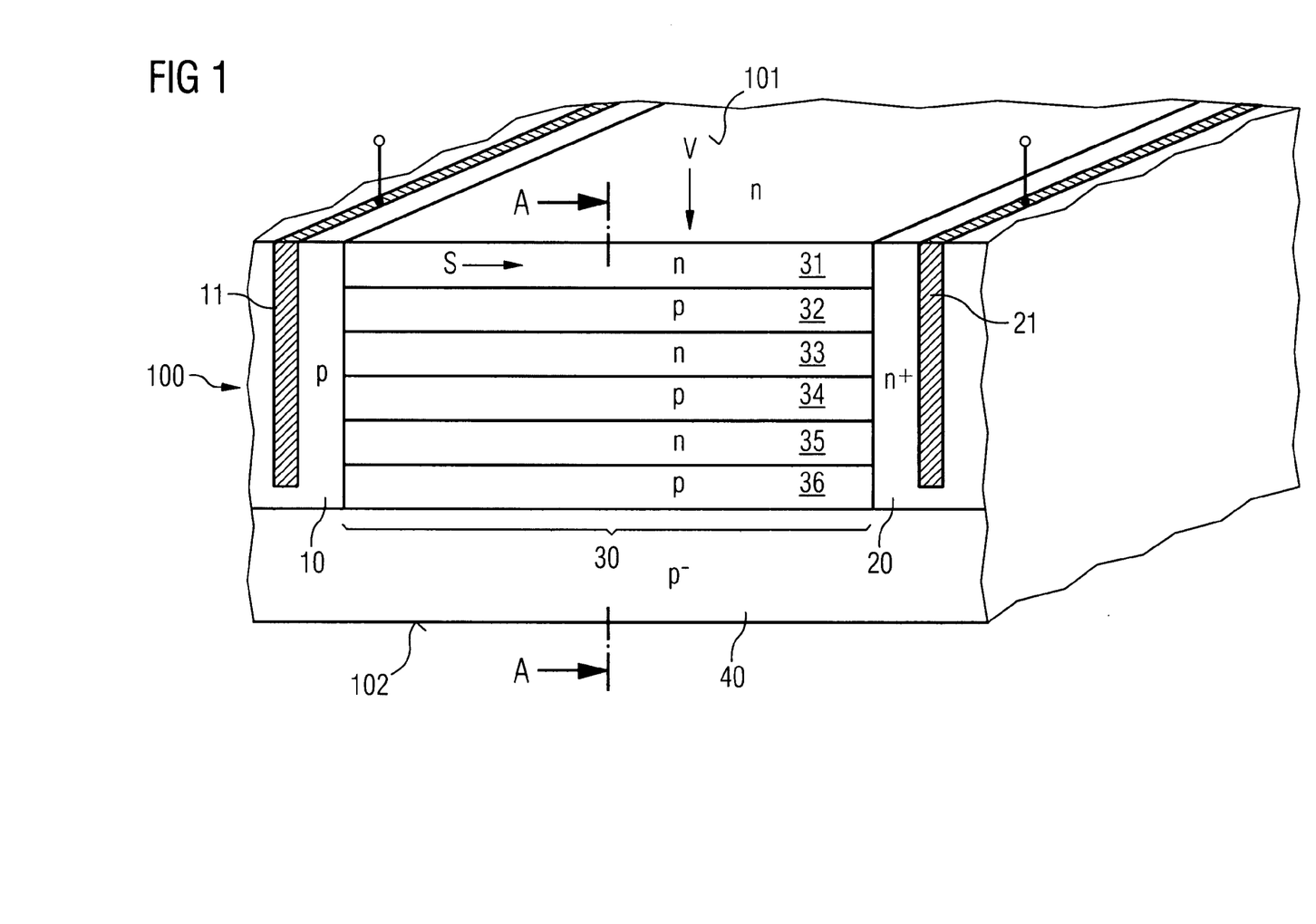
FIG. 1 illustrates an exemplary embodiment of a semiconductor component according to the invention, formed as a diode, in a perspective illustration.

FIG. 1 illustrates one exemplary embodiment of a semiconductor component according to the invention, formed as a diode. The component comprises a p-doped first semiconductor zone 10, which forms the anode zone of the diode and which can be contact-connected by means of an electrode 11 extending into the first semiconductor zone 10. The component furthermore comprises a heavily n-doped second semiconductor zone 20, which is arranged at a distance from the first semiconductor zone 10 and which can be contact-connected by means of a connection electrode 21 likewise extending into said semiconductor zone 20. A drift zone 30 is formed between the first semiconductor zone 10 and the second semiconductor zone 20, which drift zone in the exemplary embodiment is constructed in layer-like fashion and has alternately n-doped third semiconductor zones 31, 33, 35 and p-doped fourth semiconductor zones 32, 34, 36.

A pn junction is formed between the first semiconductor zone 10 and the third semiconductor zones 31, 33, 36 which pn junction is forward-biased when a positive voltage is applied between the first connection electrode 11 and the second connection electrode 21, so that an electron current can flow via the third semiconductor zones 31, 33, 36 and, in the opposite direction, a hole current can flow between the first semiconductor zone 10 and the second semiconductor zone 20. Upon application of a reverse voltage between the first and second connection electrodes 11, 21 or the first and second connection zones 10, 20, respectively, said pn junction between the first semiconductor zone 10 and the n-doped third semiconductor zones 31, 33, 35 is reverse-biased, as a result of which, as the reverse voltage increases, a space charge zone propagates proceeding from the pn junction in the direction of the second semiconductor zone 20 in the drift zone. The p-doped fourth semiconductor zones arranged adjacent to the third semiconductor zones 31, 33, 35 serve to compensate for the free charge carriers in the n-doped third semiconductor zones 31, 33, 35 in the off-state case in the manner which is sufficiently known in the case of compensation components. The total quantity of the n-type dopant atoms in the drift zone 30 in this case preferably corresponds to the total quantity of all the p-type dopant atoms in the drift zone 30, so that there are no longer any free charge carriers present in the event of maximum reverse voltage in the drift zone 30 and the n-doped third semiconductor zones 31, 33, 35 and the p-doped fourth semiconductor zones 32, 34, 36 completely deplete one another of free charge carriers.

A current flow direction S is defined in the drift zone 30, which direction is illustrated by the arrow in FIG. 1 and runs in the direction in which the drift zone 30 enables a current flow between the first and second semiconductor zones 10, 20. In this case, the current flow direction designates the flow direction of the electron current or of the opposite hole current. In order to increase the dielectric strength of the semiconductor component illustrated in FIG. 1, it is provided that the degree of compensation defined in accordance with equation (1) varies in a direction perpendicular to the current flow direction S at least in a section of the drift zone 30. Instead of degree of compensation, which represents the ratio of n—type dopant atoms to p-type dopant atoms, a term that is also used is net doping, an n-loaded net doping designating an excess of n-type dopant atoms in a predetermined region and a p-loaded net doping designating an excess of p-type dopant atoms in a predetermined region, those regions being considered which contain a section of a third and a fourth semiconductor zone in a direction perpendicular to the pn junctions between adjacent third and fourth semiconductor zones 31–36.

One component illustrated in FIG. 1 is formed as a lateral semiconductor component in a semiconductor body 100, the first semiconductor zone 10, the second semiconductor zone 20 and the drift zone 30 being applied on a weakly p-doped semiconductor substrate 40 and the first connection electrode 11 and also the second connection electrode 21 being able to be contact-connected at a front side 101 of the semiconductor body. The drift zone 30 is bounded by the front side 101 of the semiconductor body and, on the opposite side, by the substrate 40. The doping of the n-doped third semiconductor zone 31, 33, 35 and of the p-doped fourth semiconductor zone 32, 34, 36 is preferably chosen such that the degree of compensation rises in the direction V perpendicular to the current flow direction proceeding from the surface 101, the degree of compensation being negative in the region of the surface 101 (that is to say a p-loaded net doping is present in this region). Correspondingly, the degree of compensation becomes positive in the drift zone 30 with increasing proximity to the semiconductor substrate 40 (that is to say an n-loaded net doping is present there). In a central region between the front side 101 and the semiconductor substrate 40, the degree of compensation preferably lies in the vicinity of zero, so that third semiconductor zones and fourth semiconductor zones arranged adjacent in this region, for example the third semiconductor zone 33 and the fourth semiconductor zone 34, completely deplete one another in the off-state case, while adjacent third and fourth semiconductor zones in the upper region, for example the third semiconductor zone 31 and fourth semiconductor zone 32, do not completely compensate one another, so that an excess of p-type charge carriers remains in this region. Correspondingly, adjacent third semiconductor zones and fourth semiconductor zones, for example the semiconductor zones 35 and the semiconductor zones 36, in the lower region of the drift zones, do not completely mutually compensate for one another so that n-type charge carriers remain there, which, however, compensate for the remaining p-type charge carriers in the upper region, so that all free charge carriers are depleted in the event of maximum reverse voltage.

In a known manner described thoroughly in DE 198 40 032 C1, the degree of compensation in the drift zone of a compensation component influences the field strength distribution in the off-state case, smaller field strengths prevailing in those regions in which the degree of compensation is not zero, that is to say in those regions in which adjacent n-doped zones and p-doped zones cannot mutually completely deplete one another, than in those semiconductor regions in which the degree of compensation is zero, that is to say in which adjacent p-doped zones and n-doped zones completely deplete one another. One embodiment of the invention makes use of this insight in order to influence the field strength profile by varying the degree of compensation perpendicular to the current flow direction S in such a way that the field strengths are lower, but at least not higher, in the edge region of the drift zone, for example in the region below the surface 101 than in more inward regions of the drift zone 30. This reduction of the field strengths in the edge region of the drift zone counteracts known effects which reduce the dielectric strength particularly in the edge region of semiconductor components. Owing to the known relationship between the on resistance and the dielectric strength, the procedure according to one embodiment of the invention, namely varying the degree of compensation perpendicular to the current flow direction and allowing it to rise proceeding from the edge region makes it possible either to increase the dielectric strength with the on resistance remaining the same or to reduce the on resistance with the dielectric strength remaining the same.

In addition to changing the degree of compensation transversely with respect to the current flow direction S, it is furthermore possible to vary the degree of compensation along the current flow direction, as is described for example in DE 198 40 032 C2.

In order to obtain a degree of compensation that rises proceeding from the front side 101 perpendicular to the current flow direction S, it is possible for the n-doped third semiconductor zones 31, 33, 35 to be doped identically in each case and for the doping of the p-doped fourth semiconductor zones 32, 34, 36 to be varied, the doping decreasing proceeding from the front side 101 perpendicular to the current flow direction S from fourth semiconductor zone to fourth semiconductor zone, or increasing in the direction of the front side 101.

As an alternative, it is possible for the p-doped fourth semiconductor zones 32, 34, 36 to be doped identically in each case and for the degree of doping of the n-doped third semiconductor zones 31, 33, 35 to be varied in such a way that the doping increases proceeding from the front side 101 from third semiconductor zone to third semiconductor zone in the direction perpendicular to the current flow direction S.

As a further alternative, it is possible to vary both the degree of doping of the third semiconductor zones 31, 33, 35 and the degree of doping of the fourth semiconductor zones 32, 34, 36, the doping of the third semiconductor zones 31, 33, 35 then increasing proceeding from the front side 101 and the doping of the p-doped fourth semiconductor zones 32, 34, 36 decreasing perpendicular to the current flow direction proceeding from the front side 101.

In some cases, the doping is chosen so that, at least in an inner region of the drift zone 30, there are sections present in which a degree of compensation of zero is achieved, by virtue of adjacent p-doped zones and n-doped zones thus mutually completely depleting one another in the off-state case. The doping in the individual third and fourth semiconductor zones is at least approximately homogeneous.

Moreover, it is possible for the degree of doping near to the front side 101 to be set such that it is negative, and for the degree of doping in the remaining regions of the drift zone 30 at a distance from the surface to be set such that it is equal to, to be precise somewhat greater than, zero.

Figure 2:
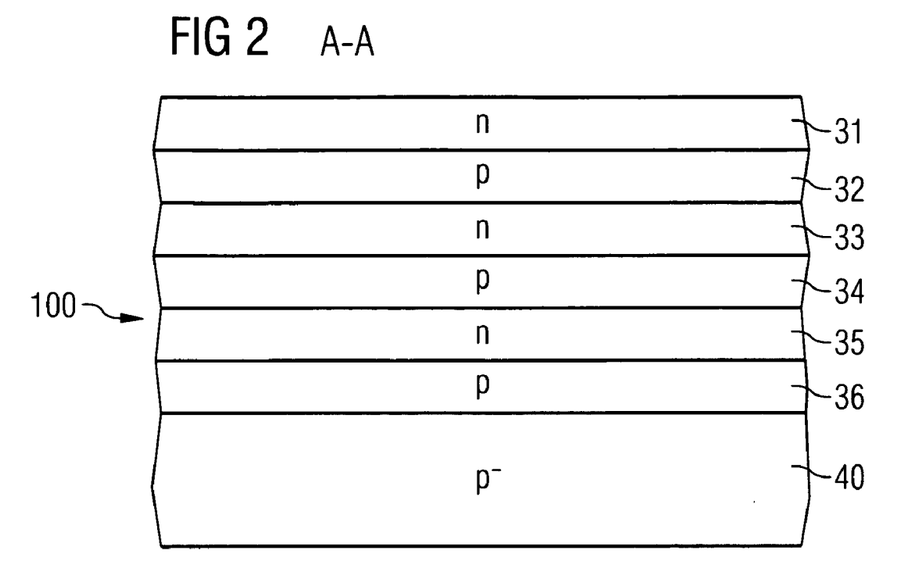
FIG. 2 illustrates a cross section through the semiconductor component in accordance with FIG. 1 in a sectional plane A—A.

The semiconductor component illustrated in FIGS. 1 and 2 is based on a drift zone 30 constructed from alternately arranged n-doped layers 31, 33, 35, which form the third semiconductor zones, and p-doped layers 32, 34, 36, which form the fourth semiconductor zones.

Figure 3:
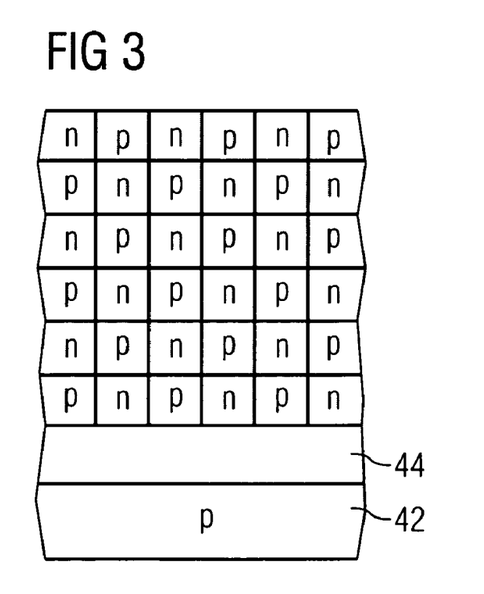
FIG. 3 illustrates a cross section—corresponding to FIG. 2—through a further exemplary embodiment of a semiconductor component according to the invention.

FIG. 3 illustrates a cross section—corresponding to the cross section in accordance with FIG. 2—through the drift zone of a semiconductor component in accordance with a further embodiment. In this exemplary embodiment the drift zone is constructed from a multiplicity of elongated n-doped and p-doped semiconductor zones which are arranged alternately and appear as squares in cross section. In this exemplary embodiment, the degree of compensation rises, proceeding from the interface formed by the front side 101, in a direction perpendicular to the current flow direction, the current flow direction in FIG. 3 running perpendicular to the plane of the drawing. As additionally illustrated in FIG. 3, the p-doped semiconductor substrate 40 in accordance with FIG. 1 may also be replaced by a so-called SOI substrate having a semiconductor substrate 42 and an insulation layer 44 applied to the semiconductor substrate 42, the active regions of the semiconductor component being formed in the semiconductor layer above the insulation layer 44.

Figure 4:
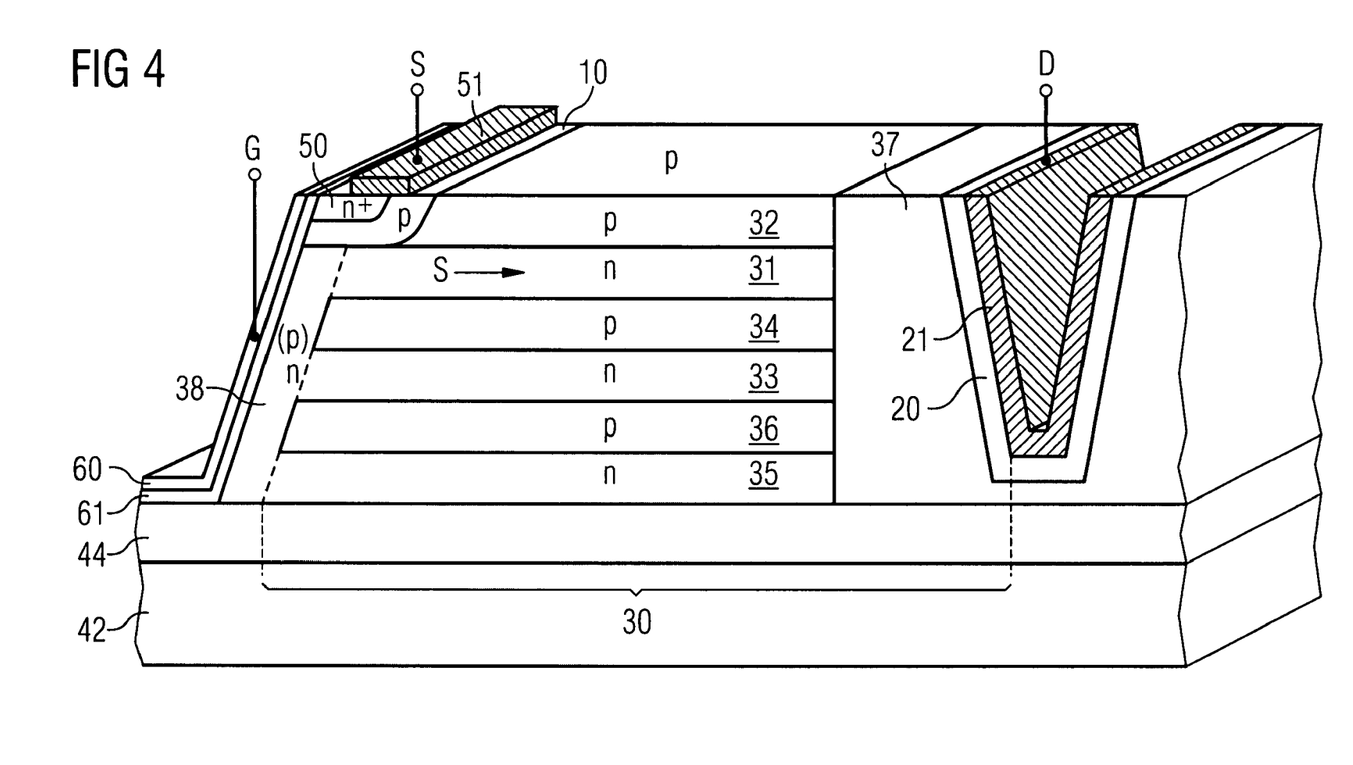
FIG. 4 illustrates a semiconductor component according to the invention, formed as a MOS transistor, in a perspective view.

FIG. 4 illustrates an exemplary embodiment of a semiconductor component according to one embodiment of the invention that is formed as a MOS transistor, is similar in construction to the diode in accordance with FIG. 1 and is likewise formed as a lateral semiconductor component. The component comprises a p-doped first semiconductor zone 10, which forms the body zone of the transistor, a heavily n-doped second semiconductor zone 20, which forms the drain zone of the semiconductor component, a drift zone 30 formed between the body zone 10 and the drain zone 20, and also a heavily n-doped source zone 50 arranged in the body zone 10 at a distance from the drift zone 30. The body and source zones 10, 50 are arranged in the region of a front side 101 of the semiconductor body 100, in which the component is formed, the source zone 50 being contact-connected by a source electrode 51, which simultaneously short-circuits the source zone 50 and the body zone 10 in a known manner. A gate electrode 60 is arranged in a manner insulated from the source zone 50, the body zone 10 and the drift zone 30, which gate electrode is arranged in a trench extending in V-shaped fashion into the semiconductor body 100 and is insulated from the semiconductor body 100 by an insulation layer, for example a semiconductor oxide 61. When a control voltage is applied to the gate electrode 60, a conductive channel forms in the body zone 10 along the insulation layer 61 and enables a current flow between the source zone 50 and the drain zone 20 upon application of a positive voltage between the drain zone 20 and the source zone 50 via the n-doped third semiconductor zones 31 of the drift zone 30.

A semiconductor zone 38 extends along the gate electrode 60 in the semiconductor body 100, said semiconductor zone being formed in strip-type fashion perpendicular to the direction of the drawing, the individual strips being alternately p-doped and n-doped. P-doped strips of the semiconductor zone 38 connect the p-doped fourth semiconductor zones 34, 36 to the body zone, and, in the event of a reswitching-on, enable p-doped charge carriers to flow away from the fourth zones, conductive channels likewise forming the p-doped strips when a drive potential is applied to the control electrode. The n-doped strips of the semiconductor zone 38 enable an electron current from the body zone 10 and the p-doped strips of the semiconductor zone 38 into the third semiconductor zones 31, 33, 35.

In the exemplary embodiment, the drift zone 30 furthermore comprises an n-doped region 37 adjoining the drain zone 20, so that the p-doped fourth semiconductor zones 32, 34, 36 do not reach as far as the drain zone 20. However, it is also possible to dispense with this further n-doped semiconductor zone 37, so that the structure with the alternately arranged n-doped third semiconductor zones 31, 33, 35 and p-doped fourth semiconductor zones 32, 34, 36 reaches as far as the drain zone 20.

In this component, the degree of compensation varies in the drift zone 30 in the direction V perpendicular to the current flow direction S in the manner already explained with reference to the component in FIG. 1, the degree of compensation increasing proceeding from the front side 101, which upwardly bounds the drift zone 30, in the direction V perpendicular to the current flow direction S. In this case, the degree of compensation is negative in the region below the front side 101, while it is correspondingly positive on the opposite side of the drift zone, and the degree of compensation being zero in an inner region of the drift zone 30. As an alternative, the degree of compensation may be zero in the region of the front side and greater than zero in the remaining regions at a distance from the front side. Overall, the doping concentration of the third and fourth semiconductor zones 31–36 including the n-doped semiconductor zones 37, 38 is chosen such that all free charge carriers are depleted in the drift zone 30 at a maximum reverse voltage.

The MOS transistor illustrated in FIG. 4 is applied on a SOI substrate comprising a semiconductor substrate 42 and an insulation layer applied to the semiconductor substrate 42.

Figure 5A:
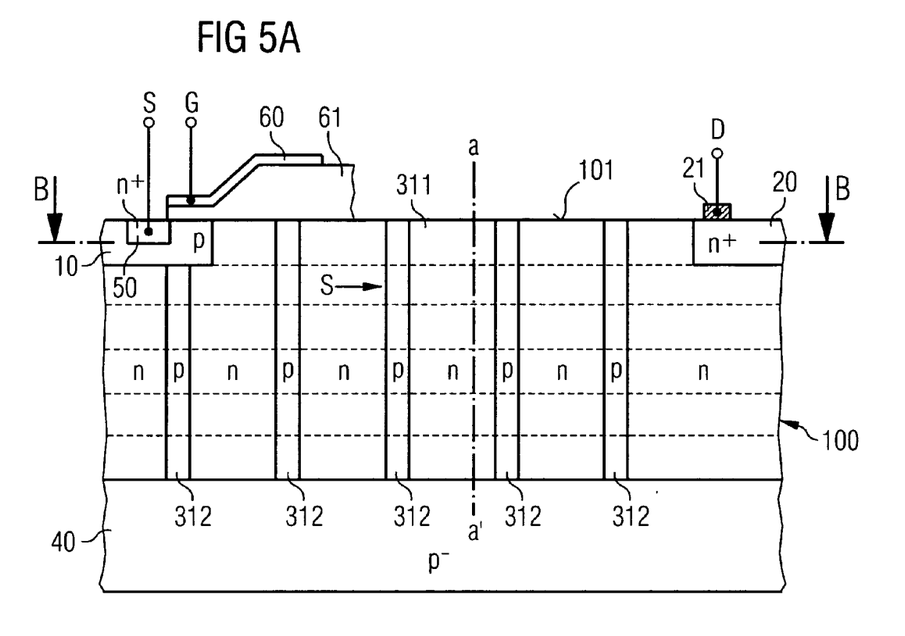
Figure 5B:
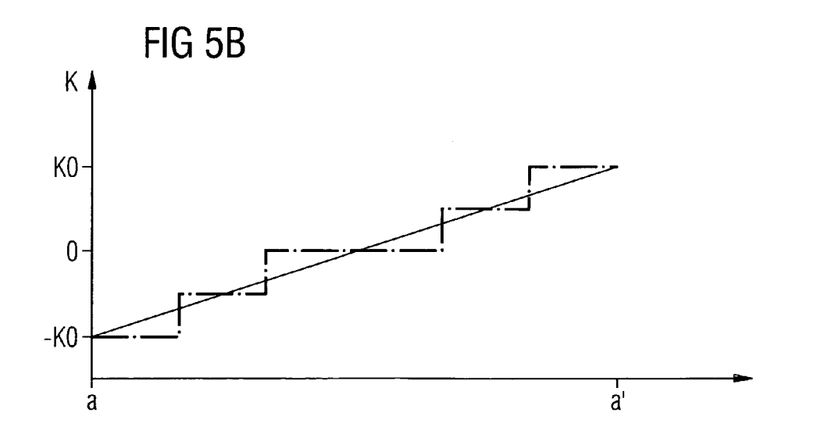
Figure 6:
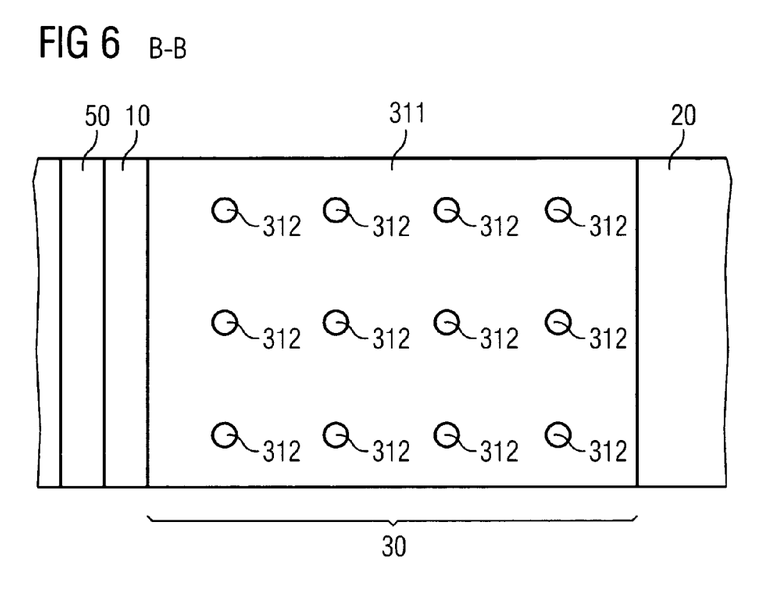
FIG. 6 illustrates a cross section through the semiconductor component according to the invention as illustrated in FIG. 5 in a sectional plane B—B.

FIGS. 5 and 6 illustrate a further exemplary embodiment of a semiconductor component according to the invention, the fundamental structure of this semiconductor component being known.

The semiconductor component illustrated in FIGS. 5 and 6 is formed as a lateral MOS transistor whose body zone 10 and drain zone 20 are arranged in the region of the front side 101 of the semiconductor body 100, in which the component is integrated. The source zone 50 is arranged in the body zone 10 and contact-connected by a source electrode 51, which short-circuits the body zone 10 and the source zone 50. The drain zone 20 is contact-connected by a drain electrode 21 in a corresponding manner.

An electrode 60 is arranged in a manner insulated by an insulation layer 61 above the front side 101 of the semiconductor body 100 and comprises a first section, which serves as a gate electrode and runs above the body zone 10 between the source zone 50 and a drift zone 30 arranged between the body zone 10 and the drain zone 20. Adjoining this gate electrode section, the electrode 60 has a stepped section serving as a field plate.

As can be gathered in particular from the cross section—illustrated in FIG. 6—along the sectional plane B—B shown in FIG. 5, the drift zone 30 comprises an n-doped third semiconductor zone, which is arranged above a p-doped substrate 40 and in which the body zone 10 and the drain zone 20 are embedded at a distance from one another in the lateral direction. The drift zone 30 furthermore comprises a multiplicity of p-doped fourth semiconductor zones 312 which are formed in pillar-type fashion, are arranged at a distance from one another in the n-doped third semiconductor zone 311 and extend in the vertical direction of the semiconductor body 100, that is to say perpendicular to the current flow direction S, between the front side 101 and the substrate 40. The pillars 312 are illustrated with a circular cross section, by way of example, in FIG. 6. Any desired further cross-sectional forms, in particular hexagonal or rectangular cross sections, can be employed.

The doping of the third semiconductor zone 311 and of the pillar-type fourth semiconductor zones 312 is chosen such that the degree of compensation varies perpendicular to the current flow direction S and increases proceeding from the front side 101 in the direction V perpendicular to the current flow direction S. In the component in accordance with FIG. 5, the degree of compensation can be determined by determining the difference between the n-type dopant atoms and the p-type dopant atoms in a plane or in a very thin layer parallel to the current flow direction in accordance with equation 1 and dividing the value obtained by the number of n-type dopant atoms in said plane.

The variation of the degree of compensation transversely with respect to the current flow direction may be achieved for example by virtue of the fact that the third semiconductor zone 311 is homogeneously doped, while the p-type doping of the pillar-type fourth semiconductor zones decreases in the vertical direction of the semiconductor body 100 proceeding from the front side 101. Correspondingly, it is possible to dope the pillars 312 homogeneously and to vary the doping of the third semiconductor zone 311, and increasing doping of the third semiconductor zone 311 proceeding from the front side 101 being necessary for a degree of compensation which rises proceeding from the front side 101.

In this semiconductor component in accordance with FIGS. 5 and 6, the total doping of the third semiconductor zone 311 and of the pillar-type fourth semiconductor zones 312 arranged therein is chosen such that the total number of n-type dopants and the total number of p-type dopants in the drift zone 30 are at least approximately equal, so that, when a maximum reverse voltage is applied, the drift zone is completely depleted of free charge carriers. In order to reduce the field strengths in the region of the front side 101, the degree of compensation is preferably negative in the drift zone 30 below the front side 101, that is to say a p-loaded net doping is present, while at least one section in which the degree of compensation is zero is present in the interior of the drift zone 30 at a distance from the front side 101.

FIG. 5B illustrates by way of example the profile of the degree of compensation along a line running perpendicular to the current flow direction S between a point a at the front side 101 and a point a' at the boundary with the substrate 40. This degree of compensation K may rise continuously if the doping of the p-doped pillars 312 or of the n-doped zone 311 changes continuously perpendicular to the current flow direction S, which is ultimately represented by the solid line in FIG. 5B. The degree of compensation at the point a is designated by −K0 in FIG. 5B, and the degree of compensation at the point a' is K0. This value for the degree of compensation K0 lies for example in a range of between 10% and 20%, and −K0 correspondingly between −10% and −20%. In one embodiment, the profile of the degree of compensation K along the line a–a' is stepped, a region of greater or lesser width in which the degree of compensation is zero being present in the interior of the drift zone 30. Such a stepped profile of the degree of compensation can be produced in a simple manner in the case of the production method explained in DE 201 . . . for a component in accordance with FIGS. 5 and 6. In said production method, n-doped epitaxial layers are successively deposited on the substrate 40, p-doped islands in each case being introduced into the epitaxial layers by means of a mask technique, which islands join together to form the p-doped pillars 312 during a concluding diffusion step. In this case, the variation of the degree of compensation may be achieved by depositing identically doped epitaxial layers, while the doping of the p-type islands forming the later pillars 312 varies from epitaxial layer to epitaxial layer.

The subdivision of the drift zone 30 into individual epitaxial layers is illustrated by broken lines in FIG. 5A. The width of one of the steps in the profile of the degree of compensation in accordance with FIG. 5B corresponds to the width of said epitaxial layers or multiples thereof. By way of example, six such epitaxial layers are illustrated in the example in accordance with FIG. 5, the doping being chosen such that, in the two central epitaxial layers, the associated sections of the p-doped pillars 312 and the associated n-doped sections of the epitaxial layers completely compensate for one another, so that the degree of compensation is zero in the region of these two layers.

For the sake of completeness, it should be pointed out that the semiconductor component in accordance with FIG. 5 may also be formed on a substrate which, instead of the semiconductor substrate 40, comprises an SOI substrate having a semiconductor substrate and an insulation layer applied thereto.

Figure 7:
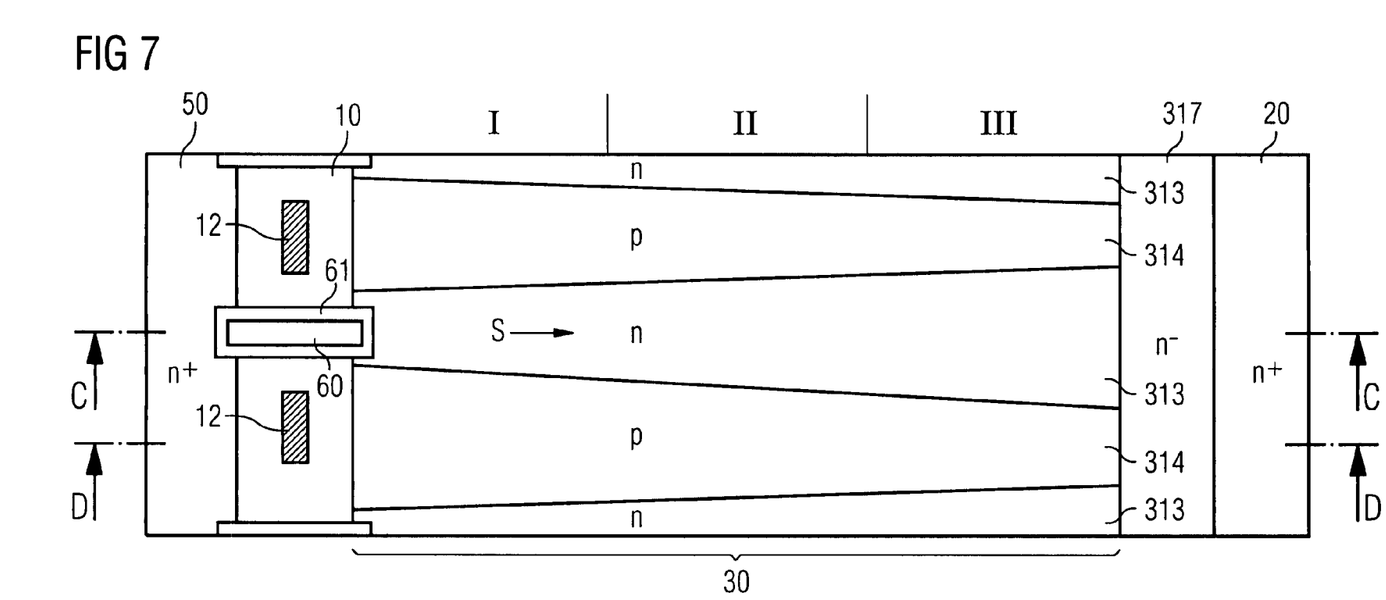
FIG. 7 illustrates a cross section through a further exemplary embodiment of a semiconductor component according to the invention in plan view.
Figure 8:
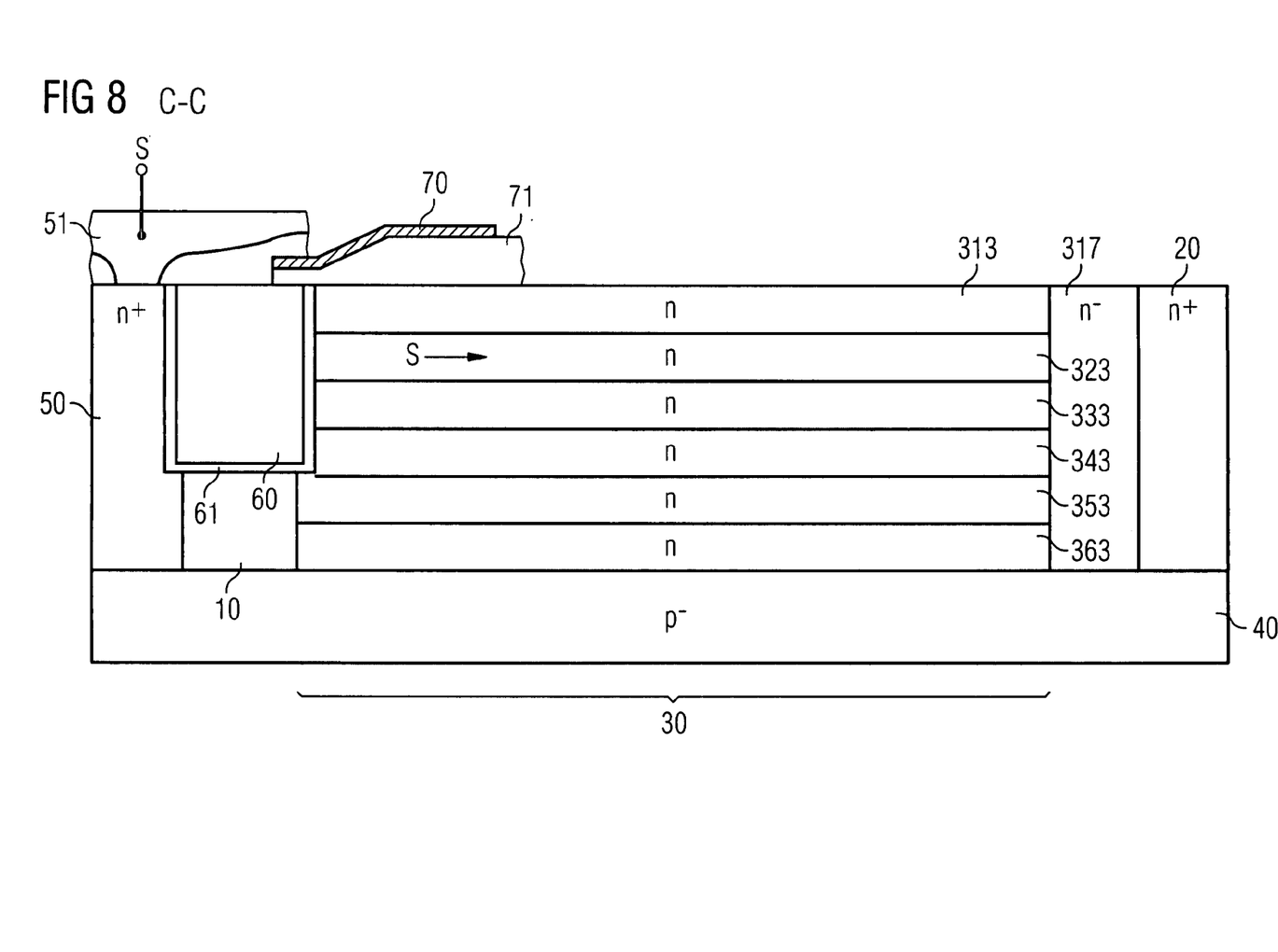
FIG. 8 illustrates a cross section through the semiconductor component in accordance with FIG. 7 in a sectional plane C—C.
Figure 9:
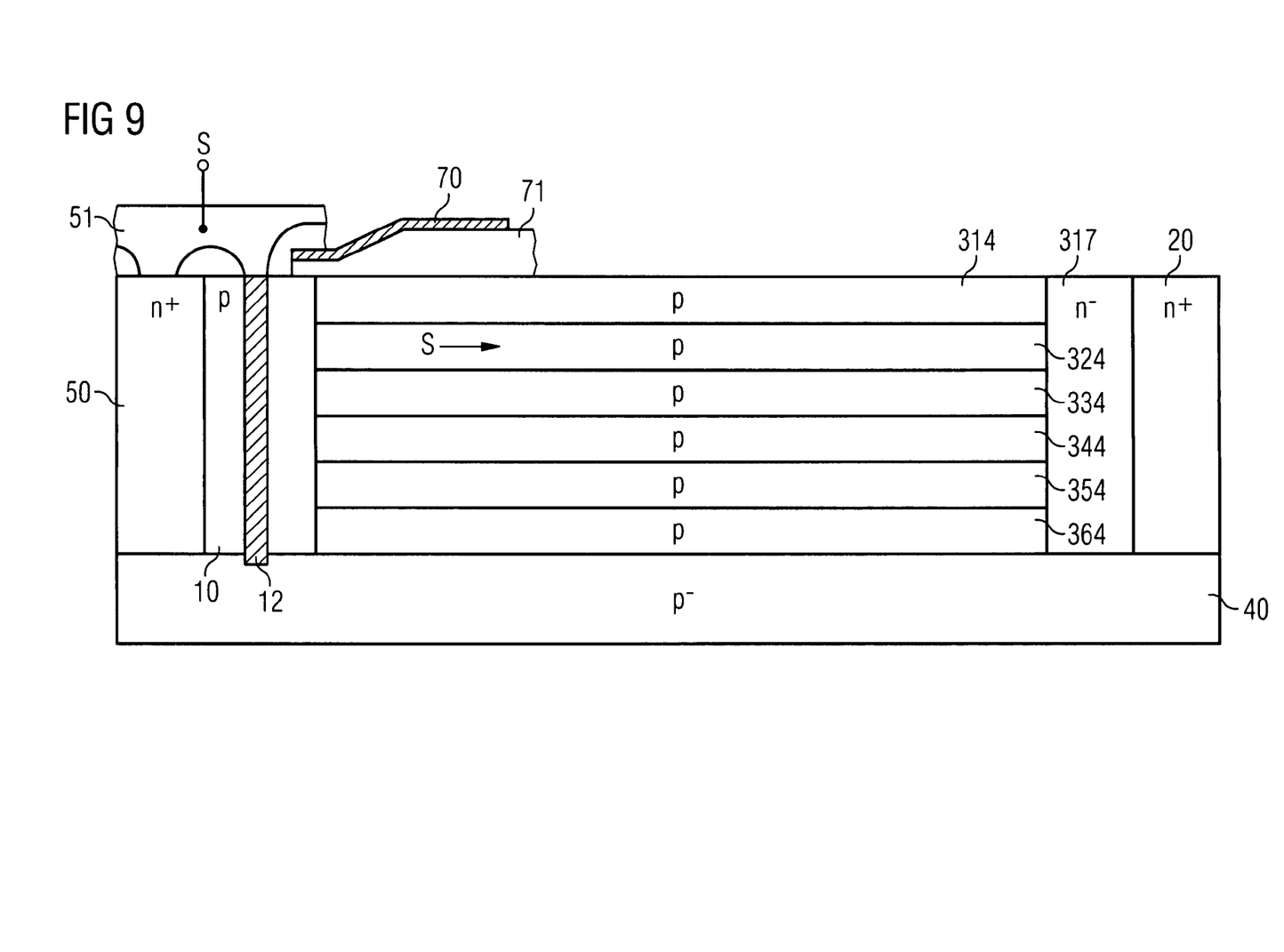
FIG. 9 illustrates a cross section through the semiconductor component in accordance with FIG. 7 in a sectional plane D—D.

FIGS. 7–9 illustrate a further exemplary embodiment of a semiconductor component in accordance with the invention, FIG. 7 showing the semiconductor component in plan view in cross section and FIGS. 8 and 9 showing this semiconductor component along the sectional plane C—C and D—D, respectively, in FIG. 7. The component is formed as a so-called lateral sidewall transistor and comprises a semiconductor substrate 40, on which the p-doped body zone 10 and the n-doped source zone 20 are arranged at a distance from one another in the lateral direction. Arranged between the body zone 10 and the source zone 20 is a drift zone 30 which comprises n-doped third semiconductor zones 313–363 and p-doped fourth semiconductor zones 314–364 and also an n-doped semiconductor zone 317 between these complementarily doped third and fourth semiconductor zones 313–364 and the drain zone 20. However, this additional n-doped semiconductor zone 317 may be dispensed with. Such a sidewall transistor is known in principle from DE 198 40 032 C2.

The body zone 10, the drift zone 30 and the drain zone 20 in each case reach from the front side 101 of the semiconductor body 100, in which the component is formed, as far as the substrate 40. In this case, the body zone 10 is arranged between the drift zone 30 and an n-doped source zone 50, which likewise reaches from the front side 101 as far as the substrate 40. In trenches extending in the vertical direction, that is to say perpendicular to the current flow direction S, into the semiconductor body 100, gate electrodes 60 are formed in a manner insulated from the semiconductor body, said gate electrodes reaching in the lateral direction from the source zone 50 right into the drift zone 30, in which case a conductive channel forms between the source zone 50 and the drift zone 30 in the body zone 10 along the sidewalls of said gate electrodes 60 upon application of a drive potential, the gate electrodes (of which only one is illustrated in FIG. 7) being arranged in such a way that these join one of the n-doped third semiconductor zones 313–363 along the conductive channels forming sidewalls in the drift zone. The source zone 50 and the body zone 10 are short-circuited by means of a source electrode 51 arranged above the semiconductor body 100, pillars 12 extending in the vertical direction through the body zone 10 right into the substrate 40, which serve for improving the short circuit between source 50 and body 10. Said pillars 12 are composed for example of polysilicon or a comparable semiconductor material. Above the front side, a field plate 70 formed in stepped fashion is present in the transition region between the body zone 10 and the drift zone 30 in a manner insulated from the semiconductor body 100, said field plate being insulated from the semiconductor body 100 by means of an insulation layer 71.

Terminals for the gate electrode 60 are not explicitly illustrated in FIGS. 7–9.

In the exemplary embodiment, the drift zone 30 is constructed in layer-like fashion, as can be gathered in particular from FIGS. 8 and 9, n-doped third semiconductor zones 313–363 and p-doped fourth semiconductor zones 314–364 being arranged such that they lie next to one another alternately in each of these layers.

According to one embodiment of the invention, the degree of compensation varies in the direction V perpendicular to the current flow direction S and increases proceeding from the front side 101 of the semiconductor body 100 in the direction of the semiconductor substrate 40. This may be achieved for example by virtue of the fact that the third semiconductor zones 313 to 363 are doped identically in all the layers, while the doping of the p-doped fourth semiconductor zones 314 decreases proceeding from the front side 101 in the direction of the semiconductor substrate 40. Correspondingly, it is possible to dope the fourth semiconductor zones 314–364 identically in each case and to vary the doping concentration of the n-doped third semiconductor zones 313–363, in which case, in order to obtain a degree of compensation which rises proceeding from the front side 101, the doping concentration of the third semiconductor zones 313 increases proceeding from the front side 101 from layer to layer. Furthermore, it is also possible to cause the doping concentration of the third semiconductor zones 313 to rise proceeding from the front side 101 from layer to layer and at the same time to cause the doping of the p-doped fourth semiconductor zones 314–364 to decrease from layer to layer.

Assuming that the doping of the third semiconductor zones 313–363 of one of the semiconductor layers arranged one above the other is approximately homogeneous in each case, and that the doping of the fourth semiconductor layers 314–364 of one of the semiconductor layers arranged one above the other is also approximately homogeneous, the result is a profile of the degree of compensation which is stepped in the direction perpendicular to the current flow direction S.

The third semiconductor zones 313–363 and 314–364 preferably run in wedge-shaped fashion in the current flow direction S, as is illustrated in FIG. 7, thereby producing a degree of compensation which also varies in the current flow direction S. The advantages of such a degree of compensation which changes in the current flow direction are explained thoroughly in DE 198 40 032.

In the exemplary embodiment, the p-doped fourth semiconductor zones 314, in plan view, adjoining the body zone 10, are wider than the n-doped third semiconductor zones 313, the fourth semiconductor zones 314–364 tapering in the direction of the drain zone 20 and the third semiconductor zones 313–363 correspondingly widening in a complementary manner with respect thereto. On account of this geometry, the degree of compensation rises in the drift zone 30 proceeding from the body zone 10 in the direction of the drain zone 20. If the drift zone 30 is subdivided in the current flow direction S into three sections I, II, III, which have an approximately identical width in the example, then the doping of the third semiconductor zones 313–363 and fourth semiconductor zones 314–364 is coordinated with one another such that the degree of compensation is negative at least in the central zone II in the region of the front side 101 of the semiconductor body and increases on account of the already previously explained variation of the doping of the third and/or fourth semiconductor zones 313–363, 314–364 perpendicular to the current flow direction S in the direction of the semiconductor substrate 40.

On account of a negative degree of compensation in the region of the surface 101 in the second section II, a negative degree of compensation likewise results in the first section I adjacent to the body zone 10 on account of the wedge-shaped formation of the third and fourth semiconductor zones 313–364 and the resultant larger-area fourth semiconductor zones 314–364 in the region of the surface 101. In this case, the degree of compensation in the third semiconductor zone 3 in the region below the front side 101 may likewise be negative, but may also be zero or positive in this region. Overall, it preferably holds true in all three sections I, II, III that the degree of compensation increases proceeding from the front side 101 in the direction of the semiconductor substrate 40, which can be achieved through the above-explained variation of the doping in the third semiconductor zones 313–363 and/or the fourth semiconductor zones 314–364.

The semiconductor component in accordance with FIGS. 7–9 may also be formed on an SOI substrate instead of the p-doped semiconductor substrate 40 illustrated.

One embodiment of the present invention includes reducing, in the drift zone of semiconductor components, the field strength in an edge region of the drift zone which runs parallel to the current flow direction. This is achieved in the previously explained manner in the case of compensation components by varying the degree of compensation perpendicular to the current flow direction.

In semiconductor components having a drift zone of only one conduction type, this may be achieved by varying the doping concentration in a direction perpendicular to the current flow direction in the drift zone, as is explained below with reference to a vertical n-conducting MOS transistor in FIG. 10 and a lateral n-conducting MOS transistor in FIG. 11.

Figure 10:
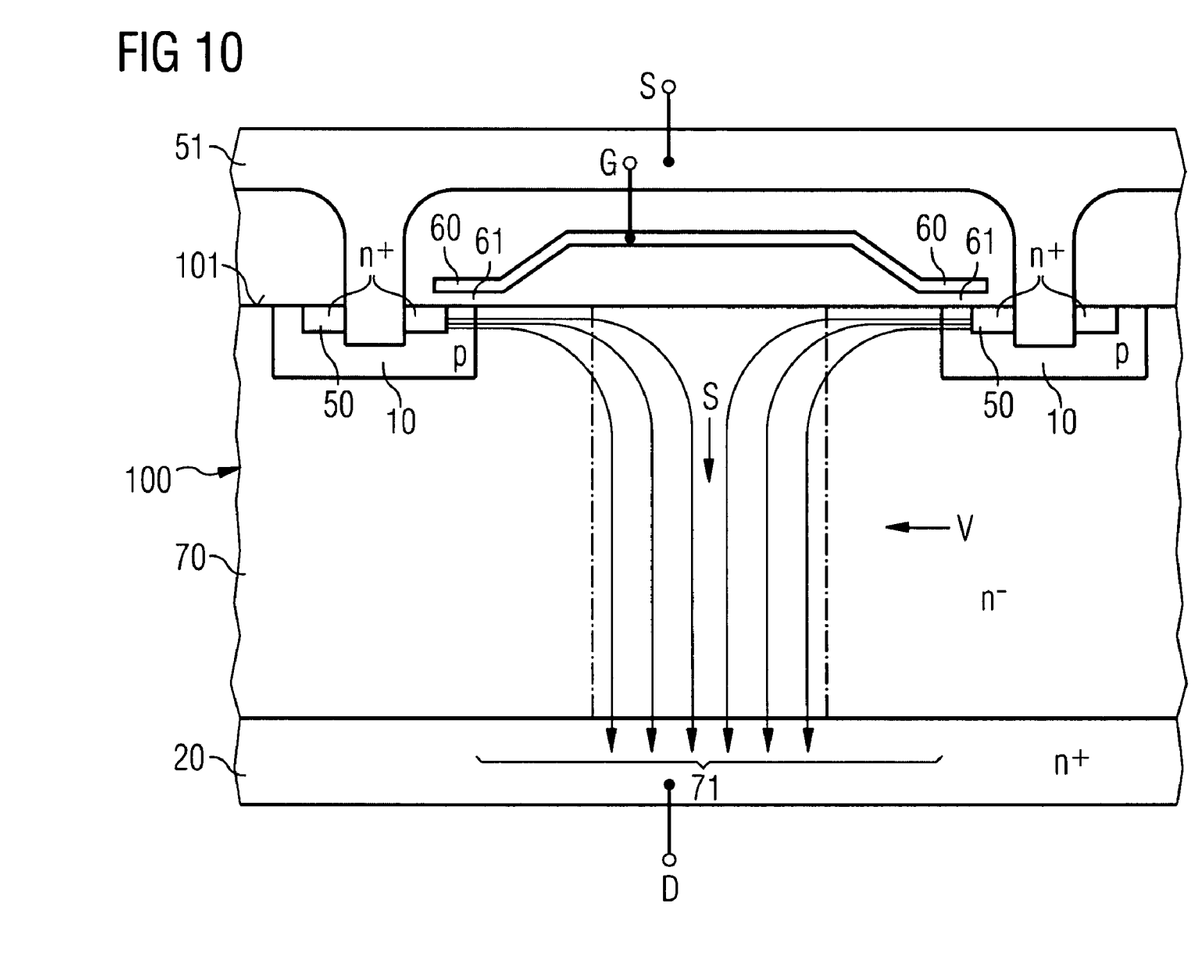
FIG. 10 illustrates an exemplary embodiment of a semiconductor component according to the invention, formed as a vertical MOS transistor, in side view in cross section.

The MOS transistor in accordance with FIG. 10 comprises, lying one above the other in the vertical direction, a heavily n-doped drain zone 20, which is formed by a semiconductor substrate, for example, a likewise n-doped drift zone 70 arranged above the drain zone 20, said drift zone being applied to the zone 20 by means of epitaxy, for example. A plurality of p-doped body zones 10 are introduced in the region of the front side 101 of a semiconductor body 100 formed by the drain zone 20 and the drift zone 70, heavily n-doped source zones 50 being introduced in turn into said body zones, the body zones 10 and the source zones 50 being short-circuited by a source electrode 51 arranged above the semiconductor body 100. A gate electrode is likewise applied above the front side 101 in a manner insulated from the semiconductor body 100, in which case, upon application of a drive potential in the body zones 10, below the gate electrode 60, conductive channels form along the front side 101 between the source zones 50 and the drift zone 70. A current flow between the source zones 50 and the drain zone 20 upon application of a positive voltage between drain D and source S with the control electrode being driven is illustrated by the arrows in FIG. 10, the current essentially flowing in a section 71 between two adjacent body zones 10 in the vertical direction of the semiconductor body 100. In order to achieve an as far as possible homogeneous current distribution in said section 71 of the drift zone 70, provision is made for varying the doping in said section 71 perpendicular to the current flow direction S in such a way that the doping in each case increases in the lateral direction proceeding from the body zones 10 in order to obtain the highest doping and thus the lowest bulk resistance in a region in the center between two adjacent body zones 50, which is illustrated in dash-dotted fashion by way of example. As a result of this, the current density is reduced in the edge region of the section 71 through which current flows, and the current is distributed more uniformly over the cross section of said section 71.

Figure 11:
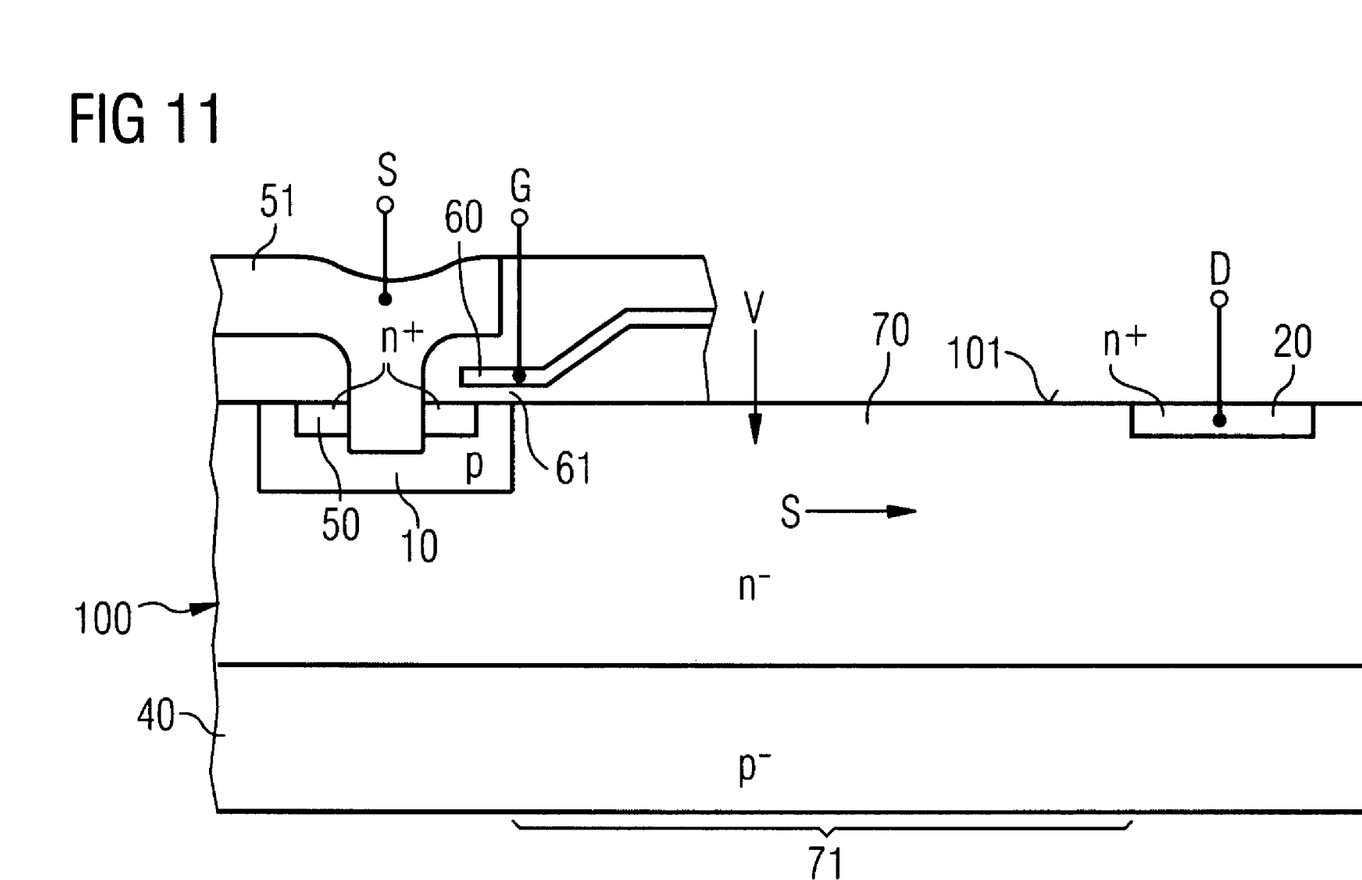
FIG. 11 illustrates an exemplary embodiment of a semiconductor component according to the invention, formed as a lateral MOS transistor, in side view in cross section.

The lateral component in accordance with FIG. 11 differs from that illustrated in FIG. 10 by the fact that the drift zone 70 is applied on a p-conducting substrate 40 and the drain zone 20 is likewise arranged in the region of the front side 101 of the semiconductor body 100, so that, when the gate electrode 60 is driven in conductive fashion, a current flow forms in the lateral direction of the semiconductor body 100 between the source zone 50 and the drain zone 20.

According to one embodiment of the invention, in the principally current-loaded section 71 of the drift zone 70 between the body zone 10 and the drain zone 20, the doping varies in the direction V perpendicular to the current flow direction S in such a way that the doping increases proceeding from the front side 101 in the vertical direction in order thereby to achieve a more homogenous current distribution in the drift zone section 71, through which current principally flows, and in particular to reduce the current density in the region of the front side 101 of the semiconductor body 100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
a first semiconductor zone of a first conduction type;
a second semiconductor zone of a second conduction type;
a drift zone arranged between the first semiconductor zone and the second semiconductor zone, wherein the drift zone has at least one third semiconductor zone of the second conduction type extending between the first semiconductor zone and the second semiconductor zone and at least one fourth semiconductor zone of the first conduction type adjoining the third semiconductor zone;
wherein the third zone enables a current flow between the first semiconductor zone and the second semiconductor zone in a current flow direction, and charge carriers of the third and fourth semiconductor zone at least partially compensate for one another in the event of a reverse-biased junction between the first semiconductor zone and the third semiconductor zone; and
wherein a degree of compensation is determined in individual regions of the drift zone by the difference between the number of dopant atoms of the first conduction type and the number of dopant atoms of the second conduction type relative to the number of dopant atoms of the second conduction type, wherein each of said individual regions in a direction perpendicular to pn-junctions between adjacent third and fourth semiconductor zones at least includes a portion of one third zone and a portion of one adjacent fourth zone, and wherein the degree of compensation varies at least in a section of the drift zone in a direction perpendicular to the current flow direction.

2. The semiconductor component of claim 1, wherein a fifth semiconductor zone of the second conduction type is arranged in the first semiconductor zone at a distance from the drift zone, and is contact-connected by a connection electrode, and wherein a control electrode is arranged adjacent to the first semiconductor zone in a manner insulated from the semiconductor zones.

3. The semiconductor component of claim 1, wherein the drift zone has a lateral edge area running parallel to the current flow direction.

4. The semiconductor component of claim 3, wherein the degree of compensation increases proceeding from the edge area at least in a section of the drift zone perpendicular to the current flow direction.

5. The semiconductor component of claim 4, wherein the drift zone has a plurality of third and fourth semiconductor zones that are arranged alternately and extend in layer-like fashion in the current flow direction.

6. The semiconductor component of claim 5, wherein the fourth semiconductor zones are in each case doped to an identical extent with dopant atoms of the first conduction type, and wherein the doping concentration of the third semiconductor zones decreases in the direction of the edge area.

7. The semiconductor component of claim 6, wherein the third semiconductor zones inherently have an at least approximately constant doping.

8. The semiconductor component of claim 7, wherein the third zones are in each case doped to an identical extent with dopant atoms of the second conduction type, and wherein the doping of the fourth semiconductor zones increases in the direction of the edge area.

9. The semiconductor component of claim 8, wherein the fourth semiconductor zones inherently have an at least approximately constant doping.

10. The semiconductor component of claim 5, wherein the doping of the third semiconductor zones with dopant atoms of the second conduction type decreases in the direction of the edge, and wherein the doping of the fourth semiconductor zones with dopant atoms of the first conduction type increases in the direction of the edge.

11. The semiconductor component of claim 4, wherein the drift zone has a third semiconductor zone extending from the first semiconductor zone as far as the second semiconductor zone, and wherein a plurality of fourth semiconductor zones formed in pillar-type fashion are arranged in the drift zone and, in terms of their longitudinal direction, extend perpendicular to the current flow direction.

12. The semiconductor component of claim 11, wherein the doping of the third semiconductor zone with dopant atoms of the second conduction type is identical at least approximately at all points, and wherein the doping of the pillar-type fourth semiconductor zone varies in the longitudinal direction thereof.

13. The semiconductor component of claim 11, wherein the doping of the third semiconductor zone with dopant atoms of the second conduction type varies in a direction perpendicular to the current flow direction, and wherein the doping of the pillar-type fourth semiconductor zone is identical at least approximately at all points in its longitudinal direction.

14. The semiconductor component of claim 4, wherein the drift zone comprises a plurality of semiconductor layers arranged one above the other, the third and fourth semiconductor zones, which are elongated in the current flow direction, are arranged alternately next to one another in each semiconductor layer, the third semiconductor zones of the individual layers are arranged one above the other, and wherein the fourth semiconductor zones of the individual layers are arranged one above the other.

15. The semiconductor component of claim 14, wherein the doping of the third semiconductor zones with dopant atoms of the second conduction type is identical at least approximately at all points, while the doping of the fourth semiconductor zones varies in a direction perpendicular to the current flow direction.

16. The semiconductor component of claim 14, wherein the doping of the fourth semiconductor zones with dopant atoms of the first conduction type is identical at least approximately at all points, while the doping of the third semiconductor zones varies in a direction perpendicular to the current flow direction.

17. The semiconductor component of claim 16, wherein the degree of compensation varies in the drift zone in the current flow direction.

18. The semiconductor component of claim 17, wherein the degree of compensation increases in the drift zone proceeding from the first semiconductor zone in the direction of the second semiconductor zone.

19. The semiconductor component of claim 18, wherein the third semiconductor zones and the fourth semiconductor zones run approximately in wedge-shaped fashion in plan view in the current flow direction.

20. The semiconductor component of claim 19, wherein the fourth semiconductor zones taper proceeding from the first semiconductor zone in the direction of the second semiconductor zone, while the third semiconductor zones widen correspondingly.

21. The semiconductor component of claim 20, wherein the doping in the individual third semiconductor zones and the individual fourth semiconductor zones is at least approximately homogeneous.

22. A semiconductor component comprising:
a first semiconductor zone of a first conduction type;
a second semiconductor zone of a second conduction type;
a drift zone of the second conduction type arranged between the first semiconductor zone and the second semiconductor zone, wherein the drift zone enables a current flow from the first semiconductor zone to the second semiconductor zone in a current flow direction;
wherein at least in a section of the drift zone, the doping concentration of dopant atoms of the second conduction type varies in a direction perpendicular to the current flow direction; and
wherein the doping of the at least one section increases, proceeding from an edge region of the section through which current flows, said edge region running in the current flow direction, perpendicular to the current flow direction.

23. The semiconductor component of claim 22, wherein the current flow direction runs parallel to a front side of a semiconductor body, wherein the first semiconductor zone, the second semiconductor zone and the drift zone are formed, and wherein the doping of the drift zone with dopant atoms of the second conduction type increases, proceeding from the front side, perpendicular to the current flow direction.

24. The semiconductor component of claims 22, wherein the current flow direction runs perpendicular to a front side of a semiconductor body in which the first semiconductor zone, the second semiconductor zone and the drift zone are formed.

* * * * *